(12) United States Patent
Carlson et al.

(10) Patent No.: US 7,265,803 B2
(45) Date of Patent: Sep. 4, 2007

(54) RECONFIGURABLE LOGIC THROUGH DEPOSITION OF ORGANIC PATHWAYS

(75) Inventors: Gregory Frank Carlson, Convallis, OR (US); Todd Alan McClelland, Corvallis, OR (US); Patrick Alan McKinley, Corvallis, OR (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 149 days.

(21) Appl. No.: 10/650,151

(22) Filed: Aug. 27, 2003

(65) Prior Publication Data

US 2005/0045375 A1  Mar. 3, 2005

(51) Int. Cl.
*G02F 1/1345* (2006.01)
*H01L 29/06* (2006.01)

(52) U.S. Cl. ................ 349/149; 349/150; 349/151; 349/152; 257/41

(58) Field of Classification Search ........... 349/149, 349/150, 151–152; 257/41
See application file for complete search history.

(56) References Cited

U.S. PATENT DOCUMENTS

| | | | | |
|---|---|---|---|---|
| 5,545,291 A | * | 8/1996 | Smith et al. ............ | 438/107 |
| 6,291,896 B1 | * | 9/2001 | Smith ..................... | 257/786 |
| 6,468,638 B2 | * | 10/2002 | Jacobsen et al. ........ | 428/209 |
| 6,816,380 B2 | * | 11/2004 | Credelle et al. ......... | 361/736 |
| 6,861,136 B2 | * | 3/2005 | Verlinden et al. ....... | 428/332 |

* cited by examiner

*Primary Examiner*—Cathy F. Lam

(57) ABSTRACT

A circuit sheet comprising a substrate and wells dispersed on the substrate operable to hold conductive polymers that form circuit devices.

14 Claims, 6 Drawing Sheets

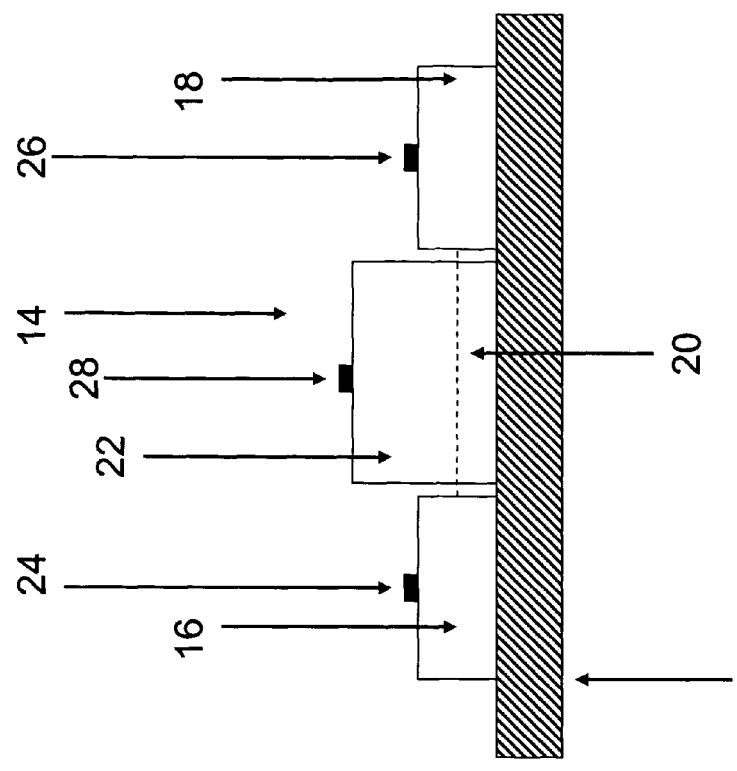
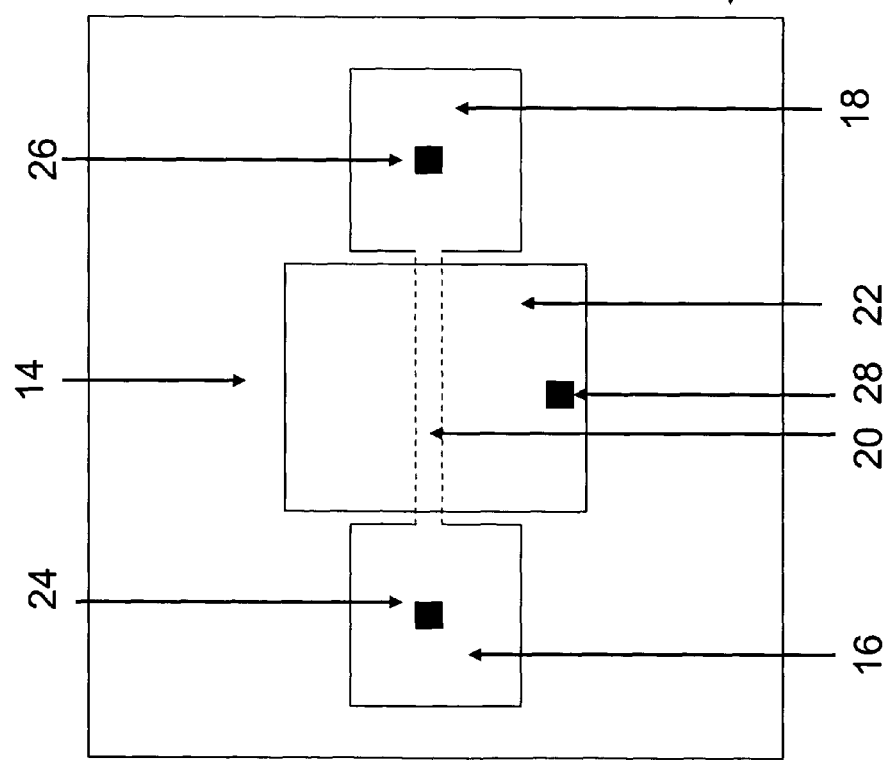
Fig. 4a
Fig. 4b

RECONFIGURABLE LOGIC THROUGH DEPOSITION OF ORGANIC PATHWAYS

BACKGROUND

Currently displays that use organic light emitting diodes (OLED) are commercially available. For example, some Motorola phones and Norelco shavers have such displays.

Advantages of OLED displays over liquid crystal displays (LCD) are that there are no viewing angle limitations because each of the OLED pixels is self-emissive and so there is no need of backlighting as in an LCD.

Furthermore, researchers are experimenting with conductive polymers to form transistors, diodes, other circuit components, and circuits from these components.

Referring to FIG. 1, OLED modules are built using polymer technology. A module includes several deposited layers of different materials. Specifically, a transparent base material 1 is generally glass or Mylar or another transparent material. On this layer is deposited a transparent electrode 2, an emitting polymer layer 3, and an electrode 4. Light 5 is generated by the polymer layer 3 and is emitted through the transparent electrode 2 and the glass 1.

There are a number of existing manufacturing techniques for making both OLED displays and conductive polymer circuits. For example, polymers can be deposited in layers using chemical vapor depositions much like with semi conductor processing. However, this technique, although it has a high yield, is relatively expensive.

Also, ink-jet printer type deposition has been suggested as a manufacturing technique where different polymers are sprayed on in desired patterns. The polymers are sprayed onto a flexible substrate such as a paper or Mylar, which allows these circuits to flex and to be rolled up. The circuits can be "printed" on large rolls of paper that are then cut up to form individual circuits.

A problem with conductive polymer circuits printed onto a substrate is that the process, and thus the spacing of the polymer components, is dependent on the limitations of the printer. For example, it is known that ink-jet printers cause splatter and bleeding, which increase the size of a printed "dot". This has not been a big problem with OLED displays, because the pixels are relatively large. But, when forming conductive polymer transistors, the relatively low resolution of ink-jet printers may limit the density of the resulting conductive polymer circuitry.

To put this potential density limitation in perspective, silicon transistors are now in the range of approximately one one-millionth the width of a human hair. But printer technology is merely in the 600 to 1200 dots-per-inch (DPI) range. Furthermore, because of splatter and the fact that devices such as transistors have different regions, e.g., source, gate, and drain, the actual number of transistors per inch may be significantly less than this, perhaps in the 25 to 50 transistors per inch range.

SUMMARY

The invention is a circuit sheet comprising a substrate and wells dispersed on the substrate to hold conductive polymers that form circuit devices.

BRIEF DESCRIPTION OF THE DRAWINGS

FIG. 4a is a magnified top view of an area of the block diagram of the pre-printed sheet from FIG. 3 showing a single transistor element and connection points for the transistor according to an embodiment of the invention.

FIG. 4b is a side view of FIG. 4a.

DETAILED DESCRIPTION

In a first embodiment of the invention, the sheets on which the circuits will be "printed" are pre-manufactured with machinery that is more precise than an ink-jet printer to include pathways or wells that are formed to hold deposited polymer layers and to retain the deposited liquid polymer within predefined regions until it dries. For example, envision a flat surface that is the substrate, and on the flat surface are predefined ridges that form troughs on top of the surface. These ridges may or may not be uniform. If there are also ridges going in the perpendicular direction, then the intersections of these ridges form wells that can be filled with polymers in layers by an ink-jet printer.

For example, assume there are three contiguous wells all in a row. The center well is used to form the channel of a transistor and the two end wells form the source and the drain. In this way, the polymer circuitry is generated layer by layer much like in a conventional semi conductor process, except that an ink jet printer head is used to do the depositing as opposed to chemical vapor deposition or other semi conductor techniques.

Figure 1:
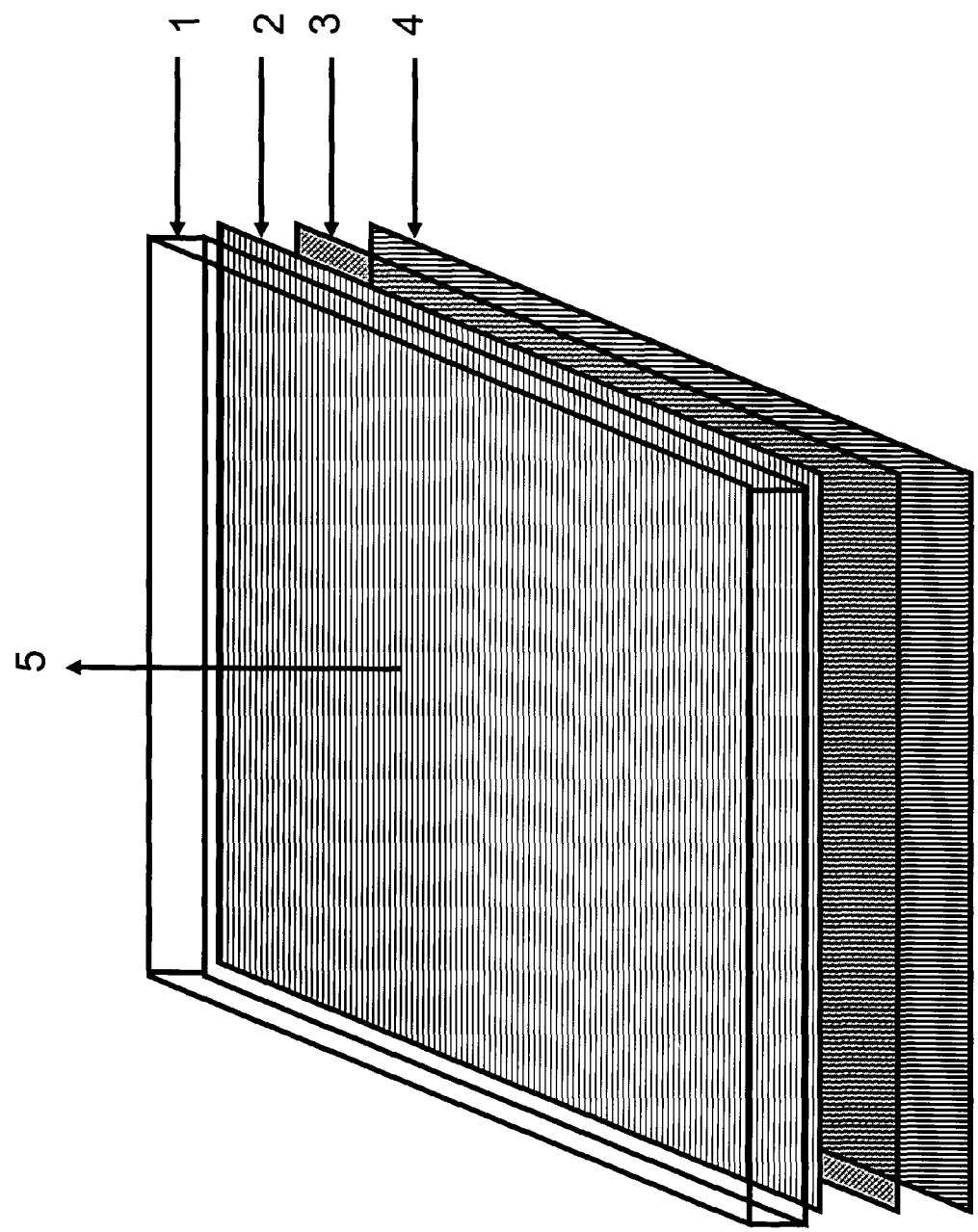
FIG. 1 is a diagram of a conventional OLED.
Figure 2:
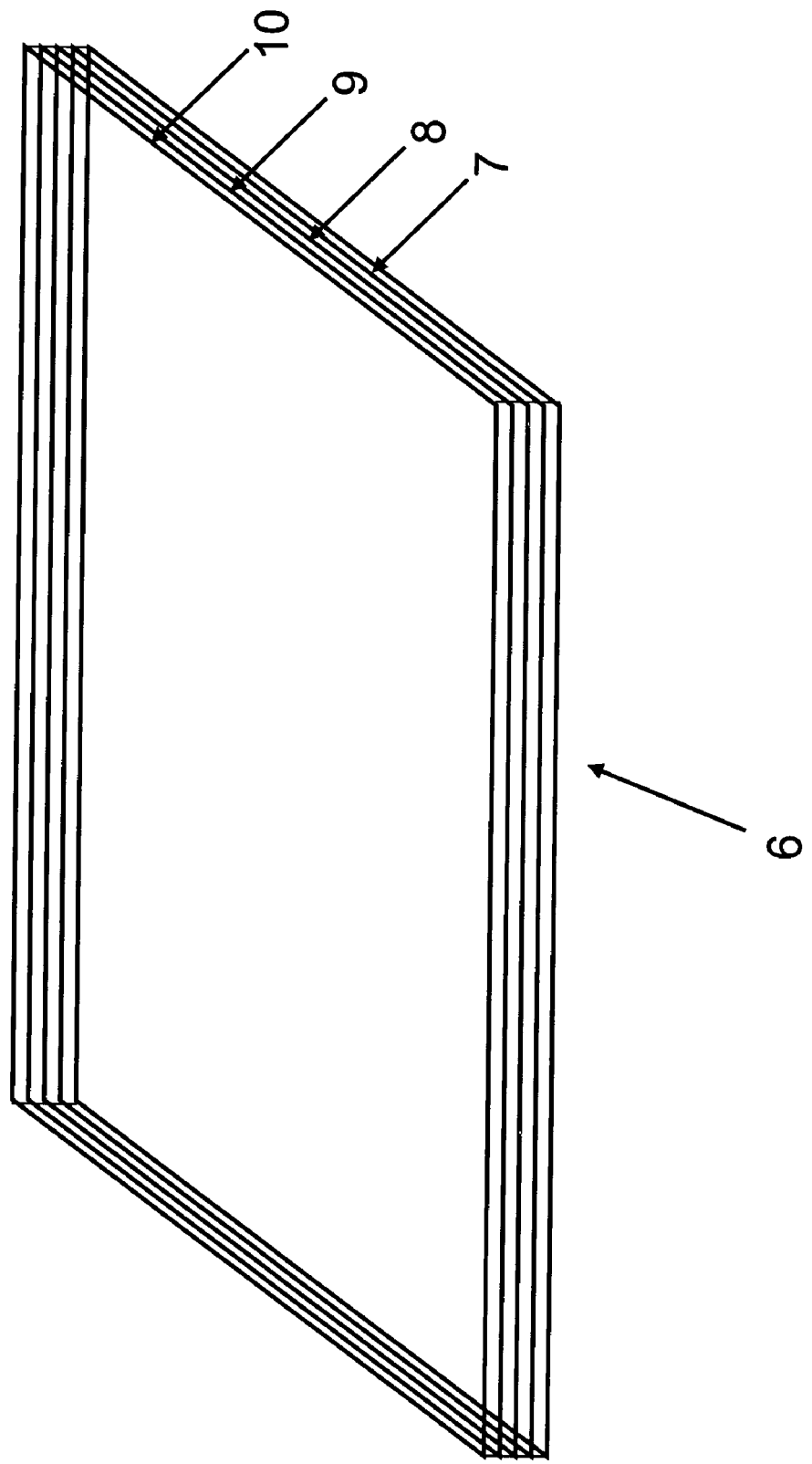
FIG. 2 is a block diagram of a pre-printed sheet with printed layers added to produce circuits and displays according to an embodiment of the invention.

Referring to FIG. 2, a self contained LED display 6 includes a substrate 7 that is pre-printed with component forms (wells) 8. These forms 8 are filled with one or more layers of conductive polymer material with an ink-jet printer (not shown). The filled forms 8 are in turn covered by one or more connection layers 9 that are printed onto the filled forms 8 with the ink-jet printer. The connection layer(s) 9 and the filled forms 8 form a circuit or circuits by interconnecting the components formed in the wells 8 in a predetermined pattern. An OLED layer 10 may be printed on top of the connection layer(s) 9 with the ink-jet printer to complete the display. Therefore, the circuitry formed by the filled forms 8 and the interconnection layer(s) 9 drive the LEDs in the display layer 10. That is, the interconnection layer(s) 9 also connect the LEDs to the drive circuitry. Where the substrate 7 is formed from a flexible material such as paper or Mylar, the display 6 may be flexible. One application for the display 6 is in a greeting card (not shown), where the display can be printed directly onto the card.

Still referring to FIG. 2, the pre-printed forms 8 are manufactured using photolithographic or stamping or other means to create the desired patterns, these means typically not being available or cost effective for a consumer. These means are capable of forming wells with relatively high densities of for example 600 per inch, thus decreasing the sizes of conductive polymer devices formed by filling the forms 8 with an ink-jet printer (not shown). In this way the process of forming a polymer circuit such as the circuit 6 is split into pre-printing the forms 8 for commercial sale to consumers, retail outlets, or service shops followed by the consumers or service shops completing the display 6 or other circuits with an ink-jet printer.

Figure 3:
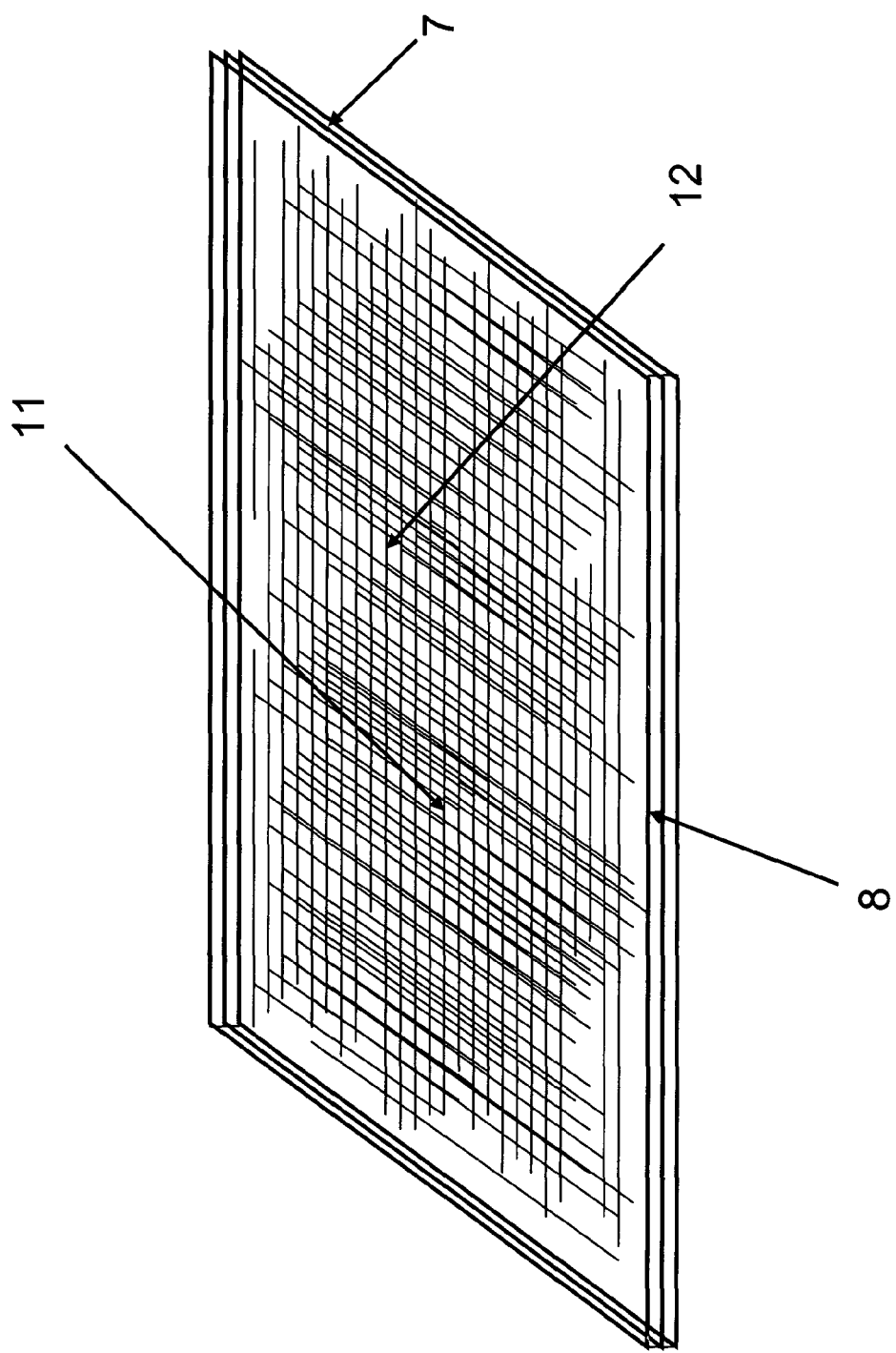
FIG. 3 is a block diagram of the pre-printed sheet from FIG. 2 showing the ridges that define pathways according to an embodiment of the invention.

Referring to FIG. 3, in one embodiment of the invention, the forms 8 are defined by criss-crossing 11 that form troughs 12. The wells 8 are defined at the intersections of these troughs. The wells 8 confine the polymers applied with an ink-jet printer to a predetermined area, and thus increase the circuit density by containing the normal splatter and bleeding. Multiple layers of the wells 8 can be formed by forming additional criss-crossing ridges 11 on the filled wells 8 of the previous layer. Furthermore, although the ridges 11 are shown as criss-crossing at right angles, they may criss-cross at any angle or in any pattern.

Referring to FIG. 4a, a magnified top view, and FIG. 4b, a magnified side view, of an area of the pre-printed substrate 7 of FIG. 3 is shown where a single transistor 14 is formed according to an embodiment of the invention. The transistor 14 is a depletion-mode PMOS type transistor having P-type source and drain regions 16 and 18, a P-type channel region 20, and a N-type gate region 22. Contact points 24, 26, and 28 respectively indicate the vias where interconnections in the layer 9 (FIG. 2) will contact the source, drain, and gate regions 16,18, and 22, respectively.

Still referring to FIGS. 4a and 4b, the transistor 14 is printed in several steps. First a P polymer is printed into the respective wells to form the source, drain, and channel regions 16,18, and 20. Because the ridges 11 (not shown in FIGS. 4a and 4b) that define the channel-region 20 well are shorter—here, approximately half as high—as the ridges that define the source- and drain-region 16 and 18 wells, the channel region 20 is shorter than the source and drain regions 16 and 18. Next, an N polymer is printed into the respective wells to form the gate region 22. Because the ridges of the gate-region well that are not contiguous with the channel region 20 are higher than the ridges of the gate-region well that are contiguous with the channel region, the gate region 22 overlaps a mid portion of the channel region 20. An NPN transistor can be formed in a similar manner by printing the N polymer first and the P polymer second. Next, an insulation layer can be printed that has via openings corresponding to the connection points 24, 26, and 28. Then, the interconnection layers(s) 9 (FIG. 2) can be printed to form the desired circuitry, such as the driver circuitry for the display 6 (FIG. 2).

Devices other than a transistor (e.g., resisters, diodes, capacitors) may be formed in the wells 8 (FIG. 2) formed on the substrate 7. For example, there may be millions of wells 8 stenciled on the substrate 7. Some groups of wells 8 will form transistors when filled with conductive polymer, and some groups will form other devices when filled. By filling predetermined groups of wells 8, one can design and implement different circuits using the pre-printed substrate 7.

Referring to FIGS. 2-4b, the ink-jet printer (not shown) that deposits the conductive polymer may operate like a plotter, where the printer head moves in two dimensions to deposit the polymers in the appropriate wells 8. Therefore, unlike semiconductor processing, which often makes a blanket deposition of material and then, using a mask layer, etches away the unwanted portions, the ink-jet printer deposits the desired polymers (and other materials such as insulators) only where needed.

Furthermore, instead of using ridges 11 to form the wells 8, the surface of the substrate 7 can be chemically treated to hold the size of the dots by preventing splatter, bleeding, or spreading. For example, such a treatment may be akin to a waxed surface of a car versus an unwaxed surface. The wax causes water to bead up, whereas on an unwaxed surface the water spreads more. Therefore, a treatment similar to waxing may be applied to the substrate 7 so as to get the same effect. Therefore, like the wells 8, this treatment limits the size of the dots of polymer by preventing them from spreading, splattering, or bleeding, and allows circuit devices to be formed on the substrate 7. Then, with the subsequent printing of a connection layer 9 (FIG. 2) over these circuit devices, a polymer circuit can be constructed in a similar fashion to the embodiment discussed above with the wells 8.

Figure 5:
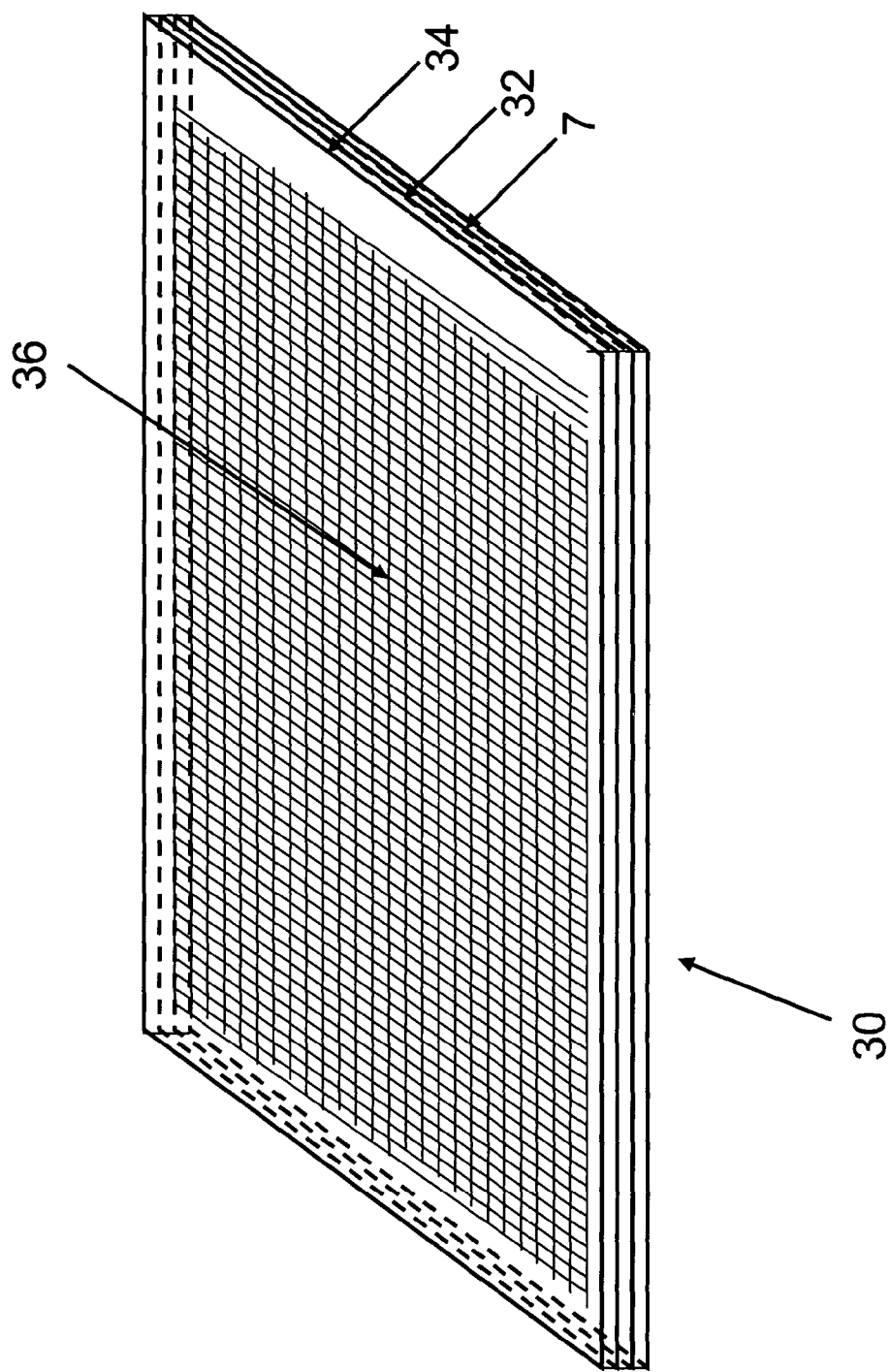
FIG. 5 is a block diagram of the pre-printed sheet from FIG. 2 with the transistors and other circuit elements already on the pre-printed sheet according to an embodiment of the invention.
Figure 6:
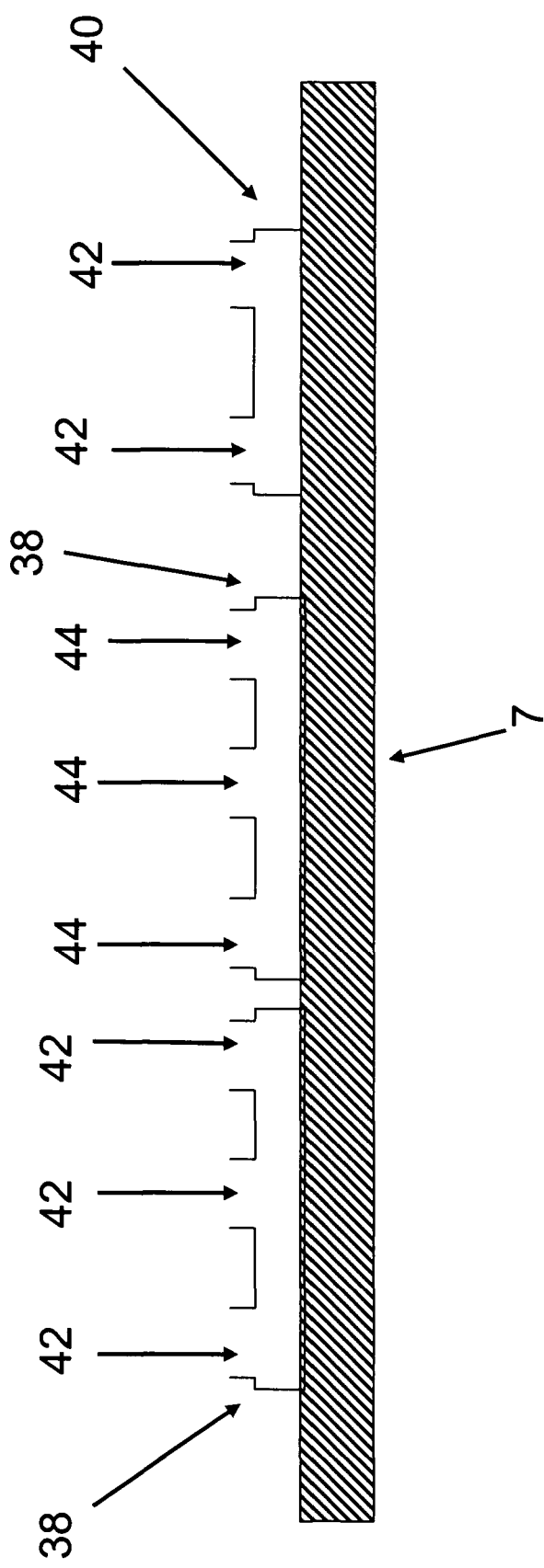
FIG. 6 is a magnified side view of an area of the block diagram of the pre-printed sheet from FIG. 5 showing a transistor element and a resistor element on the pre-printed sheet according to an embodiment of the invention.

Referring to FIGS. 5 and 6, in a different embodiment, the substrate 7 may be preprinted with circuit devices such as transistors, and combinations of circuit devices such as logic gates or blocks, and the end-user can create his own circuitry by merely printing polymer connection dots that cause a short circuit in the appropriate locations on a preprinted connection grid. This operation is similar to programming a programmable logic device (e.g., PROM) that has a matrix of lines going perpendicular to one another and by shorting together lines at a particular intersection, typically through a fuse. Or, the preprinted polymer substrate could be more like a field programmable gate array (FPGA) that includes a number of routing blocks and routing resources that could be coupled in the desired way. In this case, the ink-jet dots effectively take the place of the programmable transistors in an FPGA that make short-circuit connections.

Referring to FIG. 5, in another embodiment, a programmable circuit 30 includes a substrate 7 that is pre-printed with circuit devices 32 covered by a via matrix 34 having wells 36. By filling the appropriate wells 36 with conductive polymer to form vias, and then connecting these vias with a connection layer (not shown in FIG. 5), one can form a desired circuit.

FIG. 6 shows a magnified area of the programmable circuit 30 of FIG. 5 that includes pre-printed transistors 38 and a pre-printed resistor 40. Of course there may be many more circuit devices pre-printed on the substrate 7. If one wishes to connect the transistor and resistor to other circuit devices (not shown) to form a circuit, then he/she prints a conductive polymer into the wells 42 to form vias. Next, he/she prints a nonconductive polymer or other substance into all of the empty spaces 44. Then, he/she prints a connection layer (not shown in FIG. 6) to interconnect the vias in a desired topology to form a desired circuit. Filling the unused spaces with a nonconductive substance prevents the connection layer from interconnecting unused circuit devices. The density of circuit devices on the pre-printed sheet is again typically higher than the density achievable with an ink-jet type printer alone, and may also be higher than the density of circuits formed as discussed above in conjunction with FIGS. 2-4b.

In conclusion, using the pre-printed ridge embodiment of FIGS. 2-4b to constrain dot size provides circuit design flexibility since the customer can design his circuitry from scratch much like he could build an application specific integrated circuit (ASIC) from scratch.

Conversely, although the pre-printed circuit device embodiment of FIGS. 5 and 6 may be more constraining, it is easier in terms of the ink-jet technology to implement. This is similar to the tradeoffs between an ASIC and an FPGA, where the ASIC is more flexible but the FPGA is easier to implement because only the interconnection topology need be designed.

Examples of conductive polymers that can be used in the above embodiments include poly-paraphenylene vinylene, poly-paraphenylene (PPP), or polyaniline. However, any conductive polymer can be used.

Referring to FIGS. 2-6, some applications for this technology include a "video" Christmas card and an electronic novel. For the Christmas card, circuitry is formed from conductive polymer on the card itself according to the above embodiments, and the circuitry implements memory as well as on OLED display. The memory stores the appropriate video data, with the circuitry designed such that it will automatically play the appropriate frames, etc. Alternatively, the card could display slides or a text message.

For power, the card may use a pre-printed lithium battery, or alternatively an external power means such as batteries or a solar cell.

The electronic book application is similar, except virtually the entire page is a polymer display, and the memory used to store the novel is formed underneath the display in a multi-layer conductive polymer circuit.

The preceding discussion is presented to enable a person skilled in the art to make and use the invention. Various modifications to the disclosed embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. A circuit sheet, comprising:
a substrate;
a first set of ridges formed in a first direction on the substrate, at least one of the ridges having a first portion of a first height and having a second portion of a second height;
a second set of ridges formed in a second direction on the substrate, the second direction being substantially perpendicular to the first direction; and
wells disposed on the substrate, defined by respective intersections of the first and second sets of ridges, and operable to hold, in a liquid phase, respective conductive polymers that when in a solid phase form circuit devices that can be interconnected to form an electronic circuit.

2. The sheet of claim 1 wherein the substrate is flexible.

3. The circuit sheet of claim 1, wherein the circuit devices comprise a transistor.

4. A circuit sheet, comprising:
a substrate having at least one surface region;
conductive polymer dots disposed on the at least one surface region of the substrate and having respective sizes, the conductive-polymer dots forming a circuit device when the dots are in a solid phase; and
a chemical treatment disposed on the at least one surface region of the substrate beneath the dots, wherein the chemical treatment smoothens the surface region of the substrate and is operable to limit the sizes of the conductive polymer dots when the dots are in a liquid phase.

5. The circuit sheet of claim 4, wherein the chemical treatment comprises a wax.

6. An electronic apparatus, comprising:
a substrate;
groups of conductive polymer dots disposed on the substrate in predetermined locations when the dots are in a liquid phase, the conductive polymer dots within each group interconnected to form a respective electronic device when the dots are in a solid phase;
wells disposed on the substrate in the predetermined locations for holding the dots; and
a connection layer that interconnects the electronic devices to form an electronic circuit.

7. The apparatus of claim 6, further comprising a display disposed on the connection layer and operable to be driven by the circuit.

8. The apparatus of claim 6 wherein at least one of the conductive polymer dots comprises poly-paraphenylene vinylene (PPV).

9. The apparatus of claim 6 wherein the predetermined locations of the substrate are chemically treated to limit respective sizes of the dots.

10. The apparatus of claim 6 wherein at least one of the electronic devices comprises a respective transistor.

11. The apparatus of claim 6, further comprising at least one well holding a nonconductive polymer dot.

12. The apparatus of claim 6 wherein at least one of the conductive polymer dots comprises poly-paraphenylene (PPP).

13. A circuit sheet, comprising:
a substrate;
a first set of ridges formed in a first direction on the substrate, at least one of the ridges having a first height and at least another one of the ridges having a second height;
a second set of ridges formed in a second direction on the substrate; and
wells disposed on the substrate, defined by respective intersections of the first and second sets of ridges, and operable to hold, in a liquid phase, respective conductive polymers that when in a solid phase form circuit devices that can be interconnected to form an electronic circuit.

14. A circuit sheet, comprising:
a substrate;
a first set of ridges formed in a first direction on the substrate;
a second set of ridges formed in a second direction on the substrate, at least one ridge in the second set having a height that is different than a height of a ridge in the first set; and
wells disposed on the substrate, defined by respective intersections of the first and second sets of ridges, and operable to hold, in a liquid phase, respective conductive polymers that when in a solid phase form circuit devices that can be interconnected to form an electronic circuit.

* * * * *